US010719680B2

(12) United States Patent
Ye

(10) Patent No.: US 10,719,680 B2
(45) Date of Patent: Jul. 21, 2020

(54) FULL-SCREEN FINGERPRINT RECOGNIZING TOUCH DISPLAY SCREEN

(71) Applicant: Wuhan China Star Optoelectronics Semiconductor Display Technology Co., LTD., Wuhan (CN)

(72) Inventor: Jian Ye, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 318 days.

(21) Appl. No.: 15/743,245

(22) PCT Filed: Dec. 28, 2017

(86) PCT No.: PCT/CN2017/119410
§ 371 (c)(1),
(2) Date: Jan. 9, 2018

(87) PCT Pub. No.: WO2019/100524
PCT Pub. Date: May 31, 2019

(65) Prior Publication Data
US 2020/0082142 A1    Mar. 12, 2020

(30) Foreign Application Priority Data
Nov. 24, 2017  (CN) .......................... 2017 1 1192408

(51) Int. Cl.
*G06K 9/00* (2006.01)
*G06F 3/044* (2006.01)
(Continued)

(52) U.S. Cl.
CPC ......... *G06K 9/0002* (2013.01); *G06F 3/0412* (2013.01); *G06F 3/0446* (2019.05);
(Continued)

(58) Field of Classification Search
CPC ... G06K 9/0002; G06F 3/0446; G06F 3/0412; H01L 27/323; H01L 51/00978; H01L 51/5253
(Continued)

(56) References Cited

U.S. PATENT DOCUMENTS

2015/0378494 A1* 12/2015 Cok ...................... G06F 3/0416
345/174
2016/0306459 A1* 10/2016 Yang ..................... G06K 9/0002
(Continued)

FOREIGN PATENT DOCUMENTS

CN    106293277 A    1/2017
CN    106648257 A    5/2017
(Continued)

*Primary Examiner* — Prabodh M Dharia
(74) *Attorney, Agent, or Firm* — Kirton McConkie; Evan R. Witt

(57) ABSTRACT

The present disclosure provides a full-screen fingerprint recognizing touch display screen including switch units, pixel units, and metal mesh lines. Each pixel unit includes three sub-pixels. There is a corresponding gap between each two neighboring sub-pixels. The metal mesh lines are directly disposed corresponding to positions of gaps. The metal mesh lines are patterned into fingerprint sensing electrodes independent from each other. Each of the fingerprint sensing electrodes is connected to a corresponding one of the switch units.

18 Claims, 2 Drawing Sheets

(51) Int. Cl.
*G06F 3/041* (2006.01)
*H01L 27/32* (2006.01)
*H01L 51/00* (2006.01)
*H01L 51/52* (2006.01)

(52) U.S. Cl.
CPC ........ *H01L 27/323* (2013.01); *H01L 51/0097* (2013.01); *H01L 51/5253* (2013.01); *G06F 2203/04112* (2013.01)

(58) Field of Classification Search
USPC .................................................. 345/173, 174
See application file for complete search history.

(56) References Cited

U.S. PATENT DOCUMENTS

| | | | |
|---|---|---|---|
| 2016/0335467 A1 | 11/2016 | Su et al. | |
| 2017/0068368 A1* | 3/2017 | Hsiao | G06F 3/044 |
| 2017/0091508 A1* | 3/2017 | Han | G06F 3/041 |
| 2017/0098115 A1* | 4/2017 | Wickboldt | G06F 3/044 |
| 2017/0193265 A1* | 7/2017 | Chan | G06K 9/0002 |
| 2017/0308212 A1* | 10/2017 | Jin | G06F 3/0412 |
| 2017/0372113 A1* | 12/2017 | Zhang | G02B 5/3025 |
| 2018/0011568 A1 | 1/2018 | Cai | |
| 2018/0059689 A1* | 3/2018 | Flickinger | G05D 1/12 |
| 2018/0059831 A1* | 3/2018 | Weng | G06F 3/044 |
| 2018/0095567 A1* | 4/2018 | Lee | H01L 27/3244 |
| 2018/0190721 A1 | 7/2018 | Liu et al. | |
| 2018/0211078 A1* | 7/2018 | Lillie | G06K 9/0002 |
| 2018/0233541 A1 | 8/2018 | Zeng et al. | |
| 2019/0018523 A1* | 1/2019 | Xu | G02B 5/30 |
| 2019/0050096 A1* | 2/2019 | Wang | H01L 51/5253 |
| 2019/0384960 A1* | 12/2019 | Kwon | G06F 3/041 |

FOREIGN PATENT DOCUMENTS

| | | | |
|---|---|---|---|
| CN | 106803513 A | 6/2017 | |
| CN | 106847868 A | 6/2017 | |
| CN | 106873839 A | 6/2017 | |

* cited by examiner

FULL-SCREEN FINGERPRINT RECOGNIZING TOUCH DISPLAY SCREEN

FIELD OF INVENTION

The present disclosure relates to a technical field of touch display panels, and more particularly to a full-screen fingerprint recognizing touch display screen.

BACKGROUND OF INVENTION

Currently, touch display panels and fingerprint recognizing modules in smart phones are usually independent modules, which are separately manufactured and then assembled together. Currently, fingerprint recognition usually needs a fingerprint to be pressed on a specific fingerprint recognizing module region, such as a home button of a cell phone, e.g. IPHONE, for the fingerprint to be recognized.

Currently, an independent fingerprint recognizing module usually needs an opening to be formed in a body of a phone, and the fingerprint recognizing module to be embedded into the body of the phone. Therefore, integrality of cell phone design is affected, and meanwhile, independent fingerprint recognizing modules usually compress screen display regions (for front fingerprint recognition), decreasing screen proportions.

In summary, for existing fingerprint recognizing touch display screens, touch display panels and fingerprint recognizing modules are independent modules, and fingerprint recognition needs a fingerprint to be pressed on a specific fingerprint recognizing module region for the fingerprint to be recognized, thereby affecting integrality of display devices and decreasing screen proportions.

SUMMARY OF INVENTION

The present disclosure provides a full-screen fingerprint recognizing touch display screen that enables a touch display panel and a fingerprint recognizing module to be integrated, thereby allowing a range that fingerprint recognition is able to be performed in to be full-screen, and increasing integrality of a display device and a screen proportion.

In order to solve the aforementioned problem, the present disclosure provides the following technical solutions:

The present disclosure provides a full-screen fingerprint recognizing touch display screen, including:
  a flexible substrate;
  a buffer layer on the flexible substrate;
  a thin film transistor layer on the buffer layer;
  an anode layer on the thin film transistor layer;
  an organic light-emitting layer on the anode layer, and including pixel units, each pixel unit including three sub-pixels;
  a cathode layer on the organic light-emitting layer;
  a thin film package layer on the cathode layer; and
  metal mesh lines disposed over the thin film package layer, wherein material of the metal mesh lines is one selected from a group consisting of titanium, aluminum, molybdenum, copper, gold, silver, and any alloy material thereof;
  a protective cover disposed over the thin film package layer;
  wherein there is a corresponding gap between each two neighboring sub-pixels, the metal mesh lines are directly disposed corresponding to positions of gaps, the metal mesh lines are patterned into fingerprint sensing electrodes independent from each other, and each of the fingerprint sensing electrodes is connected to a corresponding switch unit.

In accordance with a preferred embodiment of the present disclosure, the metal mesh lines are formed on a surface of the thin film package layer on a side away from the flexible substrate, and are distributed on an entire surface of the thin film package layer.

In accordance with a preferred embodiment of the present disclosure, the metal mesh lines are formed on an inner surface of the protective cover, and are distributed on an entire surface of the protective cover.

In accordance with a preferred embodiment of the present disclosure, the metal mesh lines are patterned into at least two fingerprint sensing electrodes, and a pitch between each two of the fingerprint sensing electrodes is same as a width of each of the gaps.

In accordance with a preferred embodiment of the present disclosure, a width of each of the metal mesh lines is smaller than or equal to the width of each of the gaps between the corresponding sub-pixels.

In accordance with a preferred embodiment of the present disclosure, during a fingerprint recognizing operation, the switch unit controls the corresponding fingerprint sensing electrode to conduct, sense fingerprint capacitance, and recognize; during a touch operation, at least two switch units are closed to form a touch sensing electrode to determine a touched position.

In accordance with a preferred embodiment of the present disclosure, the touch sensing electrode is connected to a touch sensing controller, and the fingerprint sensing electrode is connected to a fingerprint sensing controller.

In accordance with a preferred embodiment of the present disclosure, the metal mesh lines are high-resolution metal lines having a resolution satisfying a predetermined value.

In accordance with a preferred embodiment of the present disclosure, a fingerprint recognition sensing manner and a touch sensing manner of the full-screen fingerprint recognizing touch display screen are self-capacitance sensing.

The present disclosure also provides a full-screen fingerprint recognizing touch display screen, including:
  a flexible substrate;
  a buffer layer on the flexible substrate;
  a thin film transistor layer on the buffer layer;
  an anode layer on the thin film transistor layer;
  an organic light-emitting layer on the anode layer, and including pixel units, each pixel unit including three sub-pixels;
  a cathode layer on the organic light-emitting layer;
  a thin film package layer on the cathode layer; and
  metal mesh lines disposed over the thin film package layer;
  a protective cover disposed over the thin film package layer;
  wherein there is a corresponding gap between each two neighboring sub-pixels, the metal mesh lines are directly disposed corresponding to positions of gaps, the metal mesh lines are patterned into fingerprint sensing electrodes independent from each other, and each of the fingerprint sensing electrodes is connected to a corresponding switch unit.

In accordance with a preferred embodiment of the present disclosure, the metal mesh lines are formed on a surface of the thin film package layer on a side away from the flexible substrate, and are distributed on an entire surface of the thin film package layer.

In accordance with a preferred embodiment of the present disclosure, the metal mesh lines are formed on an inner surface of the protective cover, and are distributed on an entire surface of the protective cover.

In accordance with a preferred embodiment of the present disclosure, the metal mesh lines are patterned into at least two fingerprint sensing electrodes, and a pitch between each two of the fingerprint sensing electrodes is same as a width of each of the gaps.

In accordance with a preferred embodiment of the present disclosure, a width of each of the metal mesh lines is smaller than or equal to the width of each of the gaps between the corresponding sub-pixels.

In accordance with a preferred embodiment of the present disclosure, during a fingerprint recognizing operation, the switch unit controls the corresponding fingerprint sensing electrode to conduct, sense fingerprint capacitance, and recognize; during a touch operation, at least two switch units are closed to form a touch sensing electrode to determine a touched position.

In accordance with a preferred embodiment of the present disclosure, the touch sensing electrode is connected to a touch sensing controller, and the fingerprint sensing electrode is connected to a fingerprint sensing controller.

In accordance with a preferred embodiment of the present disclosure, the metal mesh lines are high-resolution metal lines having a resolution satisfying a predetermined value.

In accordance with a preferred embodiment of the present disclosure, a fingerprint recognition sensing manner and a touch sensing manner of the full-screen fingerprint recognizing touch display screen are self-capacitance sensing.

The present disclosure has the following beneficial effects. Compared to existing fingerprint recognizing touch display screens, a full-screen fingerprint recognizing touch display screen provided by the present disclosure, by disposing a full-surface high-resolution metal mesh corresponding to gap positions, wherein each of the gap positions is between corresponding R/G/B light-emitting pixels of a touch display panel, and patterning the metal mesh into independent fingerprint sensing electrodes connected to corresponding switch units, integrates a fingerprint recognition function and a touch function into the touch display panel. Therefore, the touch display panel and a fingerprint recognizing module are integrated, and there is no need to independently manufacture the fingerprint recognizing module, thereby allowing fingerprint recognition to be more flexible and convenient, decreasing cost, simplifying a structure, increasing integrality of a display device and a screen proportion, and realizing full-screen fingerprint recognition.

DESCRIPTION OF DRAWINGS

In order to describe a technical solution in embodiments or existing technology more clearly, drawings required to be used by the embodiments or the existing technology are briefly introduced below. Obviously, the drawings in the description below are only some embodiments of the present disclosure. With respect to persons of ordinary skill in the art, under a premise that inventive efforts are not made, other drawings may be obtained based on these drawings.

DETAILED DESCRIPTION OF PREFERRED EMBODIMENTS

Figure 1:
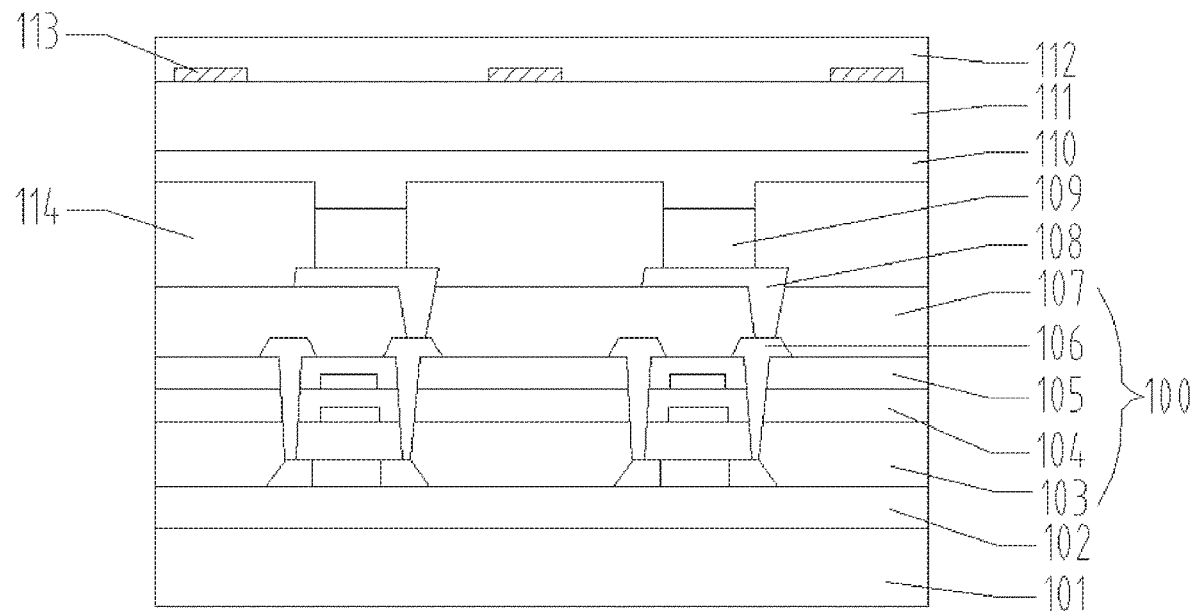
FIG. 1 is a structural diagram of a full-screen fingerprint recognizing touch display screen in accordance with an embodiment of the present disclosure.

The description of each embodiment below refers to respective accompanying drawing(s), so as to illustrate exemplarily specific embodiments of the present disclosure that may be practiced. Directional terms mentioned in the present disclosure, such as "upper", "lower", "front", "back", "left", "right", "inner", "outer", "side", etc., are only directions by referring to the accompanying drawings, and thus the used directional terms are used to describe and understand the present disclosure, but the present disclosure is not limited thereto. In the drawings, structurally similar units are labeled by the same reference numerals.

With respect to existing fingerprint recognizing touch display screens, the present disclosure solves the problem that for existing fingerprint recognizing touch display screens, touch display panels and fingerprint recognizing modules are independent modules, and fingerprint recognition needs a fingerprint to be pressed on a specific fingerprint recognizing module region for the fingerprint to be recognized, thereby affecting integrality of display devices and decreasing screen proportions. Embodiments of the present disclosure may solve the deficiencies.

FIG. 1 is a structural diagram of a full-screen fingerprint recognizing touch display screen in accordance with an embodiment of the present disclosure. As illustrated in FIG. 1, the full-screen fingerprint recognizing touch display screen of the present disclosure includes a flexible substrate 101; a buffer layer 102 on the flexible substrate 101; a thin film transistor layer 100 on the buffer layer 102; an anode layer 108 on the thin film transistor layer 100; an organic light-emitting layer 109 on the anode layer 108, and including pixel units, wherein each pixel unit includes three sub-pixels, and the different sub-pixels are separated by separating columns 115; a cathode layer 110 on the organic light-emitting layer 109; a thin film package layer 111 on the cathode layer 110; and metal mesh lines 113 disposed over the thin film package layer 111; and a protective cover 112 disposed over the thin film package layer 111. The thin film transistor layer 100 includes a first gate-insulating layer 103, a second gate-insulating layer 104, an inter-insulating layer 105, a planarization layer 107, and switch units 106. Each switch unit 106 has a source electrode and a drain electrode located at the planarization layer 107, and connected to an active layer located at the first gate-insulating layer 103 through via holes located at the inter-insulating layer 105 and the second gate-insulating layer 104. The metal mesh lines 113 may be formed on an upper surface or a lower surface of the thin film package layer 111. For a flexible active-matrix organic light-emitting diode (AMOLED) display panel, the metal mesh lines 113 may be formed on the upper surface of the thin film package layer 111 of the AMOLED display panel. The metal mesh lines 113 are distributed on an entire surface of the thin film package layer 111. The metal mesh lines 113 are patterned into at least two fingerprint sensing electrodes. Material of the metal mesh lines 113 is one selected from a group consisting of titanium, aluminum, molybdenum, copper, gold, silver, and any alloy material thereof.

There is a corresponding gap between each two neighboring sub-pixels. The separating columns 114 are located at gaps, and separate the different sub-pixels. The metal mesh lines 113 correspond to positions of the separating columns 114. A width of each separating column 114 is smaller than a width of each metal mesh line 113. A covering range of the metal mesh lines 113 is within a covering range of the separating columns 114. The organic light-emitting layer 109 is sandwiched between the anode layer 108 and the cathode layer 110. The anode layer 108 is connected to the drain electrodes of the switch units 106 through via holes located at the planarization layer 107.

In addition, the metal mesh lines 113 may also be formed on an inner surface of the protective cover 112, and are distributed on an entire surface of the protective cover 112. A width of each of the metal mesh lines 113 is smaller than or equal to a width of each of the gaps between the corresponding sub-pixels. The metal mesh lines 113 are patterned into at least two fingerprint sensing electrodes, and a pitch between each two of the fingerprint sensing electrodes is same as the width of each of the gaps.

Figure 2:
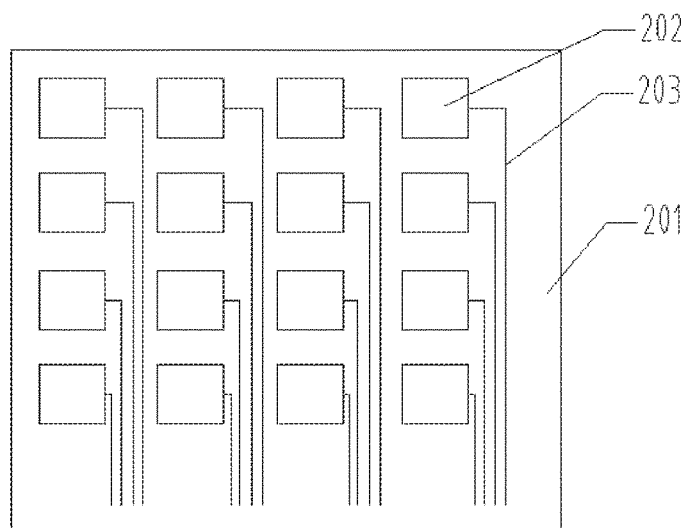
FIG. 2 is a distribution diagram of fingerprint sensing electrodes in accordance with an embodiment of the present disclosure.

FIG. 2 is a distribution diagram of fingerprint sensing electrodes in accordance with an embodiment of the present disclosure. The metal mesh lines may be formed on an upper surface or a lower surface of a thin film package layer 201 of an AMOLED display panel. The metal mesh lines are patterned into fingerprint sensing electrodes 202 arranged in an array. The metal mesh lines are patterned into at least two fingerprint sensing electrodes 202. There is a corresponding gap between each two fingerprint sensing electrodes 202 and insulating each two fingerprint sensing electrodes 202 from each other. Each of the fingerprint sensing electrodes 202 is connected to a corresponding switch unit through a corresponding sensing electrode line 203. The fingerprint sensing electrodes 202 are distributed on an entire thin film package layer 201.

Figure 3:
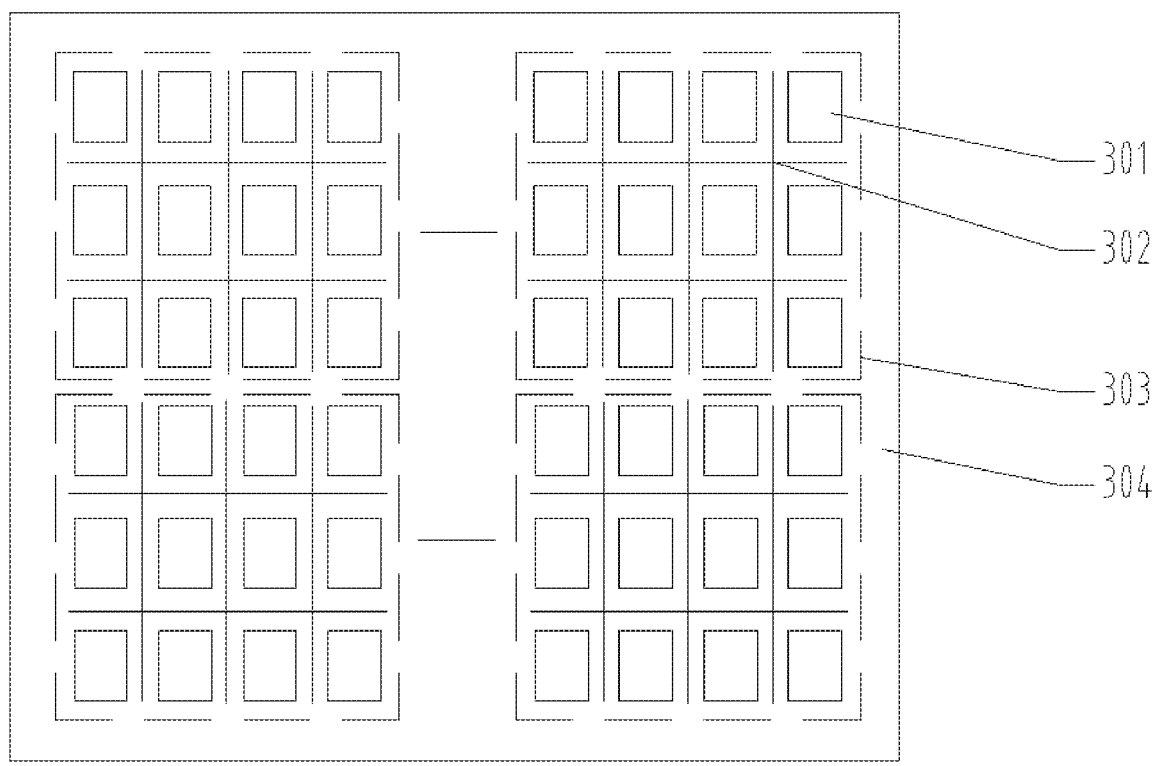
FIG. 3 is a structural diagram of touch sensing electrodes in accordance with an embodiment of the present disclosure.

FIG. 3 is a structural diagram of touch sensing electrodes in accordance with an embodiment of the present disclosure. The organic light-emitting layer includes pixel units. Each pixel unit includes three sub-pixels 301. Gaps are each formed between two corresponding neighboring sub-pixels 301. The gaps are used to define the different sub-pixels 301. Separating columns are located at the gaps. Metal mesh lines 302 are formed on a surface of a thin film package layer. The metal mesh lines 302 directly correspond to positions of the gaps. The metal mesh lines 302 are patterned into fingerprint sensing electrodes 303 independent from each other, and each of the fingerprint sensing electrodes 303 is connected to a corresponding switch unit. A pitch between each two of the fingerprint sensing electrodes 303 may be same as a width of each of the gaps. A width of each of the metal mesh lines 302 is smaller than or equal to the width of each of the gaps between the corresponding sub-pixels. The metal mesh lines 302 are high-resolution metal lines having a resolution satisfying a predetermined value, i.e., a resolution required for a fingerprint to be recognized. Touch sensing electrodes 304 are each formed by at least two corresponding fingerprint sensing electrodes 303. Each two of neighboring touch sensing electrode 304 are insulated from each other, to determine a touched position. In the present embodiment, a touch display panel and a fingerprint recognizing module are integrated. During a fingerprint recognizing operation, the fingerprint sensing electrodes are controlled by the corresponding switch units to conduct, sense fingerprint capacitance, and recognize. During a touch operation, the touch sensing electrodes 304 are each formed by closing at least two corresponding switch units, to determine a touched position.

Figure 4:
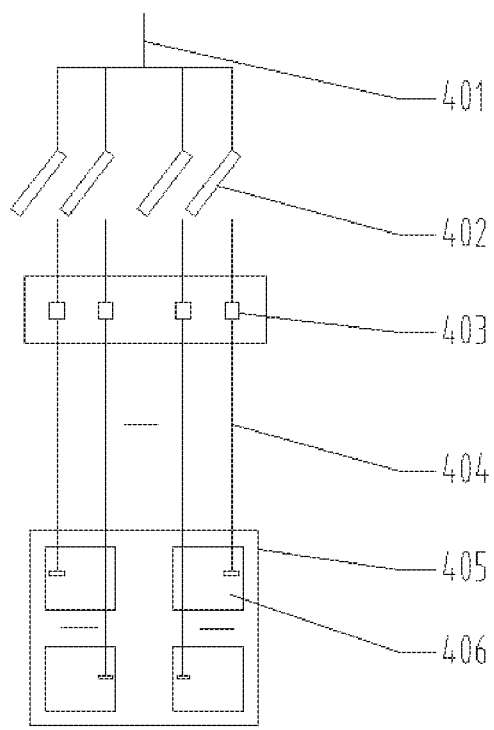
FIG. 4 is a schematic diagram illustrating fingerprint recognition and touch sensing principles in accordance with an embodiment of the present disclosure.

FIG. 4 is a schematic diagram illustrating fingerprint recognition and touch sensing principles in accordance with an embodiment of the present disclosure. Fingerprint sensing electrodes 406 are each connected to a corresponding sensing electrode line 404, and the corresponding sensing electrode line 404 is connected a corresponding switch unit 402. During a fingerprint recognizing operation, each independent fingerprint sensing electrode 406 is controlled by the corresponding switch unit 402 to conduct, and be connected to a touch sensing controller 403 to sense fingerprint capacitance and recognize a fingerprint. During a touch operation, a large touch sensing electrode 405 is formed by connecting at least two neighboring fingerprint sensing electrodes 406 which are controlled by at least two corresponding switch units 402 to conduct. After the at least two corresponding switch units 402, which are closed to form the touch sensing electrode 405, are all closed, through at least two corresponding sensing electrode lines 404 conducted, touch sensing electrode 405 is connected to a touch sensing controller 401, to sense touch capacitance, and determine a touched position. The fingerprint sensing electrodes 406 are distributed on an entire thin film package layer. Therefore, the present embodiment may realize full-screen fingerprint recognition.

In the present embodiment, a fingerprint recognition function and a touch function both use a self-capacitance sensing manner. When a finger touches the touch display panel, capacitance of the finger is added to capacitance of the touch display screen body, causing capacitance of the screen body to increase, and be detected. The preferred touch display panel further includes a driving chip. The driving chip is configured to drive to perform a fingerprint recognition function and a touch function in a time-division manner. When the touch display panel is in a fingerprint recognition mode or a touch mode, the driving chip provides a corresponding driving signal for fingerprint recognition or touch sensing. Under the fingerprint recognition mode, the fingerprint sensing electrodes are configured to recognize a fingerprint, and under the touch mode, the at least two touch sensing electrodes serve as the touch sensing electrode, which senses touch capacitance. The fingerprint sensing electrodes and the touch sensing electrode share an electrode layer and share the driving chip, thereby significantly simplifying a structure and a manufacturing process of the touch display panel.

Compared to existing fingerprint recognizing touch display screens, a full-screen fingerprint recognizing touch display screen provided by the present disclosure, by disposing a full-surface high-resolution metal mesh corresponding to gap positions each between corresponding R/G/B light-emitting pixels of a touch display panel, and patterning the metal mesh into independent fingerprint sensing electrodes connected to corresponding switch units, integrates a fingerprint recognition function and a touch function into the touch display panel. Therefore, the touch display panel and a fingerprint recognizing module are integrated, and there is no need to independently manufacture the fingerprint recognizing module, thereby allowing fingerprint recognition to be more flexible and convenient, decreasing cost, simplifying a structure, increasing integrality of a display device and a screen proportion, and realizing full-screen fingerprint recognition.

In summary, although the present disclosure has been described with preferred embodiments thereof above, it is not intended to be limited by the foregoing preferred embodiments. Persons skilled in the art can carry out many changes and modifications to the described embodiments without departing from the scope and the spirit of the present disclosure. Therefore, the protection scope of the present disclosure is in accordance with the scope defined by the claims.

What is claimed is:

1. A full-screen fingerprint recognizing touch display screen, comprising:
   a flexible substrate;
   a buffer layer on the flexible substrate;
   a thin film transistor layer on the buffer layer;
   an anode layer on the thin film transistor layer;
   an organic light-emitting layer on the anode layer, and comprising pixel units, each pixel unit comprising three sub-pixels;
   a cathode layer on the organic light-emitting layer;
   a thin film package layer on the cathode layer; and
   metal mesh lines disposed over the thin film package layer, wherein material of the metal mesh lines is one selected from a group consisting of titanium, aluminum, molybdenum, copper, gold, silver, and any alloy material thereof;
   a protective cover disposed over the thin film package layer;
   wherein the metal mesh lines are patterned into fingerprint sensing electrodes independent from each other, wherein each of the fingerprint sensing electrodes corresponds to a corresponding plurality of first sub-pixels of the pixel units in position; and wherein each of the fingerprint sensing electrodes comprises a corresponding metal mesh comprising a plurality of corresponding first metal mesh lines and a plurality of corresponding second metal mesh lines, wherein a corresponding one of the first metal mesh lines is directly disposed corresponding to a corresponding gap between each two neighboring rows of the first sub-pixels, and a corresponding one of the second metal mesh lines is directly disposed corresponding to a corresponding gap between each two neighboring columns of the first sub-pixels.

2. The full-screen fingerprint recognizing touch display screen of claim 1, wherein the metal mesh lines are formed on a surface of the thin film package layer on a side away from the flexible substrate, and are distributed on an entire surface of the thin film package layer.

3. The full-screen fingerprint recognizing touch display screen of claim 1, wherein the metal mesh lines are formed on an inner surface of the protective cover, and are distributed on an entire surface of the protective cover.

4. The full-screen fingerprint recognizing touch display screen of claim 3, wherein the metal mesh lines are patterned into at least two fingerprint sensing electrodes, and a pitch between each two of the fingerprint sensing electrodes is same as a width of each of the gaps.

5. The full-screen fingerprint recognizing touch display screen of claim 4, wherein a width of each of the metal mesh lines is smaller than or equal to the width of each of the gaps between the corresponding sub-pixels.

6. The full-screen fingerprint recognizing touch display screen of claim 5,
   wherein each of the fingerprint sensing electrodes is connected to a corresponding switch unit; and
   wherein during a fingerprint recognizing operation, the switch unit controls the corresponding fingerprint sensing electrode to conduct, sense fingerprint capacitance, and recognize; during a touch operation, at least two switch units are closed to form a touch sensing electrode to determine a touched position.

7. The full-screen fingerprint recognizing touch display screen of claim 6, wherein the touch sensing electrode is connected to a touch sensing controller, and the fingerprint sensing electrode is connected to a fingerprint sensing controller.

8. The full-screen fingerprint recognizing touch display screen of claim 1, wherein the metal mesh lines are high-resolution metal lines having a resolution satisfying a predetermined value.

9. The full-screen fingerprint recognizing touch display screen of claim 1, wherein a fingerprint recognition sensing manner and a touch sensing manner of the full-screen fingerprint recognizing touch display screen are self-capacitance sensing.

10. A full-screen fingerprint recognizing touch display screen, comprising:
    a flexible substrate;
    a buffer layer on the flexible substrate;
    a thin film transistor layer on the buffer layer;
    an anode layer on the thin film transistor layer;
    an organic light-emitting layer on the anode layer, and comprising pixel units, each pixel unit comprising three sub-pixels;
    a cathode layer on the organic light-emitting layer;
    a thin film package layer on the cathode layer; and
    metal mesh lines disposed over the thin film package layer;
    a protective cover disposed over the thin film package layer;
    wherein the metal mesh lines are patterned into fingerprint sensing electrodes independent from each other, wherein each of the fingerprint sensing electrodes corresponds to a corresponding plurality of first sub-pixels of the pixel units in position; and wherein each of the fingerprint sensing electrodes comprises a corresponding metal mesh comprising a plurality of corresponding first metal mesh lines and a plurality of corresponding second metal mesh lines, wherein a corresponding one of the first metal mesh lines is directly disposed corresponding to a corresponding gap between each two neighboring rows of the first sub-pixels, and a corresponding one of the second metal mesh lines is directly disposed corresponding to a corresponding gap between each two neighboring columns of the first sub-pixels.

11. The full-screen fingerprint recognizing touch display screen of claim 10, wherein the metal mesh lines are formed on a surface of the thin film package layer on a side away from the flexible substrate, and are distributed on an entire surface of the thin film package layer.

12. The full-screen fingerprint recognizing touch display screen of claim 10, wherein the metal mesh lines are formed on an inner surface of the protective cover, and are distributed on an entire surface of the protective cover.

13. The full-screen fingerprint recognizing touch display screen of claim 12, wherein the metal mesh lines are patterned into at least two fingerprint sensing electrodes, and a pitch between each two of the fingerprint sensing electrodes is same as a width of each of the gaps.

14. The full-screen fingerprint recognizing touch display screen of claim 13, wherein a width of each of the metal mesh lines is smaller than or equal to the width of each of the gaps between the corresponding sub-pixels.

15. The full-screen fingerprint recognizing touch display screen of claim 14,
    wherein each of the fingerprint sensing electrodes is connected to a corresponding switch unit: and wherein during a fingerprint recognizing operation, the switch unit controls the corresponding fingerprint sensing electrode to conduct, sense fingerprint capacitance, and recognize; during a touch operation, at least two switch units are closed to form a touch sensing electrode to determine a touched position.

16. The full-screen fingerprint recognizing touch display screen of claim 15, wherein the touch sensing electrode is connected to a touch sensing controller, and the fingerprint sensing electrode is connected to a fingerprint sensing controller.

17. The full-screen fingerprint recognizing touch display screen of claim 10, wherein the metal mesh lines are high-resolution metal lines having a resolution satisfying a predetermined value.

18. The full-screen fingerprint recognizing touch display screen of claim 10, wherein a fingerprint recognition sensing manner and a touch sensing manner of the full-screen fingerprint recognizing touch display screen are self-capacitance sensing.

* * * * *